United States Patent [19]
Park et al.

[11] Patent Number: 5,858,313
[45] Date of Patent: Jan. 12, 1999

[54] AEROSOL GENERATOR AND APPARATUS PRODUCING SMALL PARTICLES

[75] Inventors: Seung-Bin Park, Taejon; Yun-Chan Kang, Seoul, both of Rep. of Korea

[73] Assignee: Korea Advanced Institute of Science and Technology, Taejon, Rep. of Korea

[21] Appl. No.: 669,788

[22] Filed: Jun. 28, 1996

[30] Foreign Application Priority Data

Jul. 1, 1995 [KR] Rep. of Korea .................. 1995-19206

[51] Int. Cl.$^6$ .............................. B01J 8/04; A62C 13/62; B05B 5/00; A61M 11/00
[52] U.S. Cl. ............... 422/189; 128/200.14; 128/200.18; 128/200.17; 128/200.15; 239/690; 239/302; 239/377; 239/376
[58] Field of Search .................... 128/200.14, 200.18, 128/200.15, 200.17; 239/690, 302, 377, 376; 422/189

[56] References Cited

U.S. PATENT DOCUMENTS 4,829,996  5/1989  Noakes et al. ..................... 128/200.14
5,468,427  11/1995 Stangle et al. ............................ 264/3.4

OTHER PUBLICATIONS

Yun–Chan Kang and Seung–Bin Park, "A High–Volume Spray Aerosol Generator Producing Small Droplets for Low Pressure Applications", *J. Aerosol Sci.*, 26(7):1131–1138 (1995).

Yun–Chan Kang and Seung–Bin Park, "Preparation of Nanometre Size Oxide Particles Using Filter Expansion Aerosol Generator", *J. Mater. Sci.*, 31:2409–2416 (1966).

*Primary Examiner*—Lynette F. Smith
*Attorney, Agent, or Firm*—Darby & Darby

[57] ABSTRACT

An aerosol generator for producing fine droplets in large quantities is used in an apparatus which can produce small particles having a high degree of crystallization and large surface area. The aerosol generator includes a chamber having a porous filter and a solution, and air is supplied to an upper side of the filter. A low pressure driving force, such as by a vacuum, is supplied to the chamber below the filter to generate droplets. A pyrogenetic reactor dries and pyrolyzes the droplets produced by the aerosol generator to give ultrafine particles and an ultrafine particle collector collects the ultrafine particles obtained by the pyrogenetic reactor. The low pressure driving force moves the droplets through the pyroletic reactor.

6 Claims, 2 Drawing Sheets

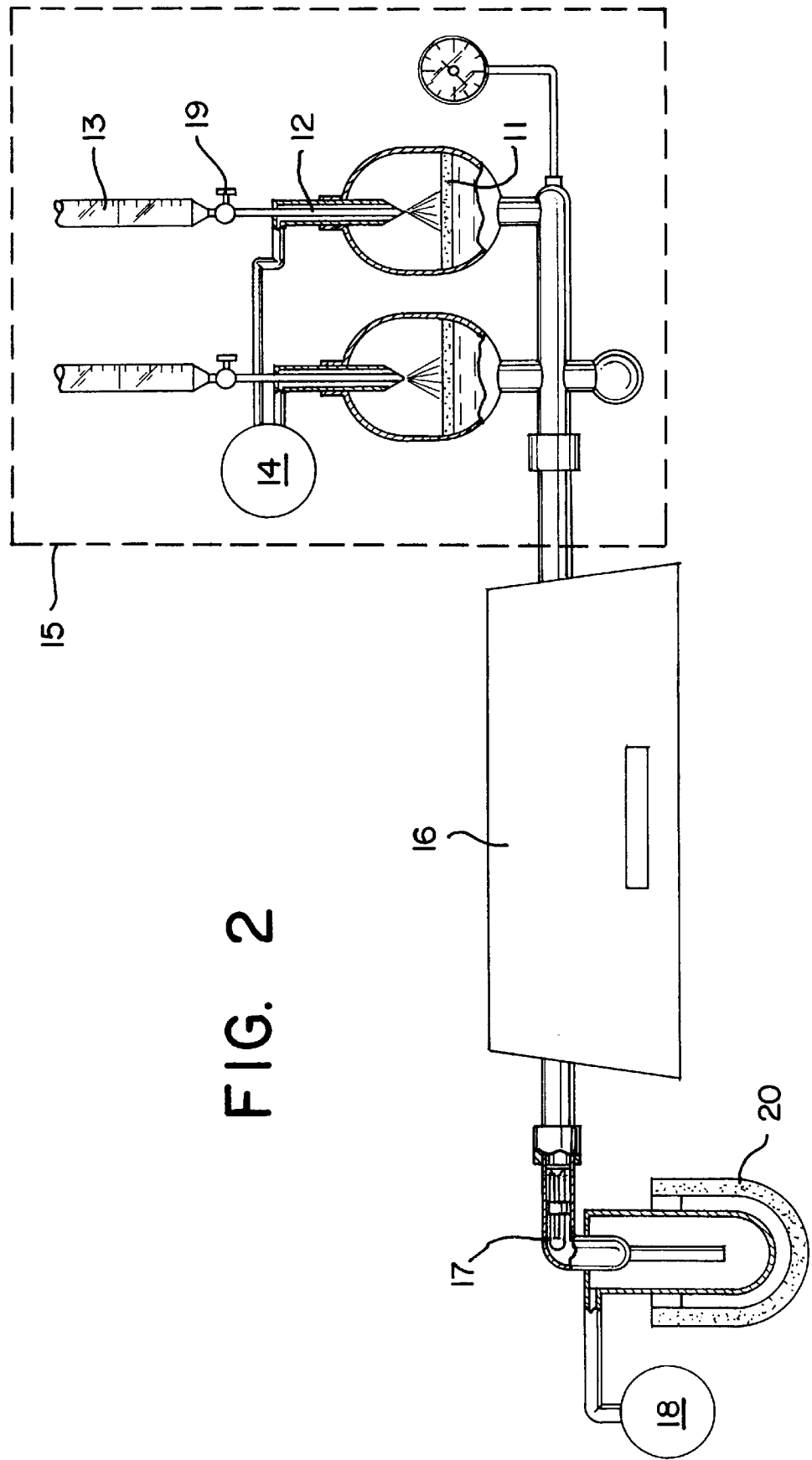

AEROSOL GENERATOR AND APPARATUS PRODUCING SMALL PARTICLES

FIELD OF THE INVENTION

The present invention relates to an aerosol generator and an apparatus equipped with the aerosol generator, more specifically, to an aerosol generator producing fine droplets massively even under a low pressure, and an apparatus equipped with the aerosol generator which can produce small particles having a high degree of crystallization and large surface area.

BACKGROUND OF THE INVENTION

As the electronics industry progresses, a lot of fine droplets under submicron size have been required in various worked materials, ceramic materials and alloys. In particular particles of nanometer size which have a low sintering temperature and high reactivity owing to large surface area, have been widely applied in the preparation of advanced materials, since it eases the preparation of inexpensive highly qualified materials. Accordingly, studies on the development of an apparatus for producing ultrafine particles have been actively carried out, since ultrafine particles having a size of submicron or below are essentially required in the preparation of various worked materials, ceramic materials and alloys as mentioned aboves.

The ultrafine particles of nanometer size have been prepared by the following methods conventional in the art.

Fine droplets can be produced by an aerosol generator, and dried and pyrolyzed to give homogeneous fine particles of submicron size, by the spray pyrolysis method. According to the spray pyrolysis method, the size of the particles is controlled primarily by the concentration of the solution employed in the method, i.e., fine particles are prepared with a solution of low concentration, which, in turn, decreases productivity of the particles. In addition to this, the spray pyrolysis method has revealed some shortcomings that: ultrafine particles of nanometer size can be produced by the decomposition of large particles, only when the solution of some solutes causing highly exothermic reaction is used; ultrafine particles thus prepared are very cohesive; and, the apparatus employed therein is operated with a low reproducibility.

Fine droplets can also be prepared with a proper solution by an aerosol generator, which are deposited on a substrate to form thin layers employed in the preparation of semiconductor, etc. The said method has an advantage that a thin layer of multicomponents can be prepared with a high growth rate, when compared with the conventional CVD (chemical vapor deposition) method, while properties of the thin layer thus prepared depend largely on the characteristics of the droplets.

On the other hand, aerosol etching method in which fine droplets are sprayed by aerosol generator and accelerated under a low pressure to strike substrate being etched, has been suggested in the art. It possesses advantages of both the conventional dry-etching method and the wet-etching method in which chemical etching is carried out with an etching solution. However, needs have continued for the development of apparatus to generate fine droplets of small size, since the efficiency of the aerosol etching method depends on the size and distribution of droplets generated by an aerosol generator.

As a consequence, to accomplish the preparation of ultrafine particles and thin layers, and the efficient etching in the preparation of semiconductors, etc., more improved aerosol generators producing fine droplets massively have been suggested in the art, some of which are disclosed in the following references:

SU 1,407,570 describes an apparatus generating droplets employing a nozzle under a high pressure. The said apparatus has a simple structure and generates a large number of droplets, the size of the droplets thus generated, however, has a size larger than about 10 micron. Thus, it has not been used widely in the preparation of thin layer and ultrafine particles whose size is submicrons or below. Moreover, it has revealed some disadvantages in that high pressure is essentially required and the size of droplets can not be modulated.

Lang, R. J. reported an apparatus generating droplets by ultrasonic spray(see: Lang, R. J., Journal of Acoustical Society of America, 34(1):6–9(1962)). The aerosol generator can produce droplets of micron size to be used effectively in the preparation of ultrafine particles and thin layers, and aerosol etching, however the said prior art aerosol generators are proven to be less satisfactory in the sense that it can not produce a large number of droplets, and whose size can not be modulated, and it may be influenced by surface tension of the solution, etc.

On the other hand, Meesters, G. M. H. et al. teaches an apparatus which produces droplets of micron size by generating a strong electric field in a solution passing through a nozzle employing taylor cone(see: Meesters, G. M. H. et al., Journal of Aerosol Science, 23(1):37–49(1992)). However, the aerosol generator has revealed some shortcomings that it can not produce a large number of droplets, and whose size can not be modulated, while requiring substantial energy and high pressure.

In addition to the aerosol generators mentioned above, vibrating orifice and electrospray, etc. have been suggested in the art, however, they require high pressure, can not produce a large quantity of droplets, and have difficulty in modulating the size of droplets, which naturally limits their practical applications to industry.

Under the circumstances, there are strong reasons for exploring alternative apparatus producing a large quantity of ultrafine particles of submicron size under a lower pressure to prepare finer particles while the productivity is not decreased.

SUMMARY OF THE INVENTION

A primary object of the present invention is, therefore, to provide an aerosol generator which can produce fine droplets even under a low pressure, whose size can be modulated.

Another object of the invention is to provide an apparatus equipped with an aerosol generator which can produce a large number of incohesive ultrafine particles of submicron size.

BRIEF DESCRIPTION OF DRAWINGS

The above and the other objects and features of the present invention will become apparent from the following description given in conjunction with the accompanying drawings, in which:

FIG. 2 is a schematic diagram depicting an apparatus producing ultrafine particles of the invention.

DETAILED DESCRIPTION OF THE INVENTION

Figure 1:
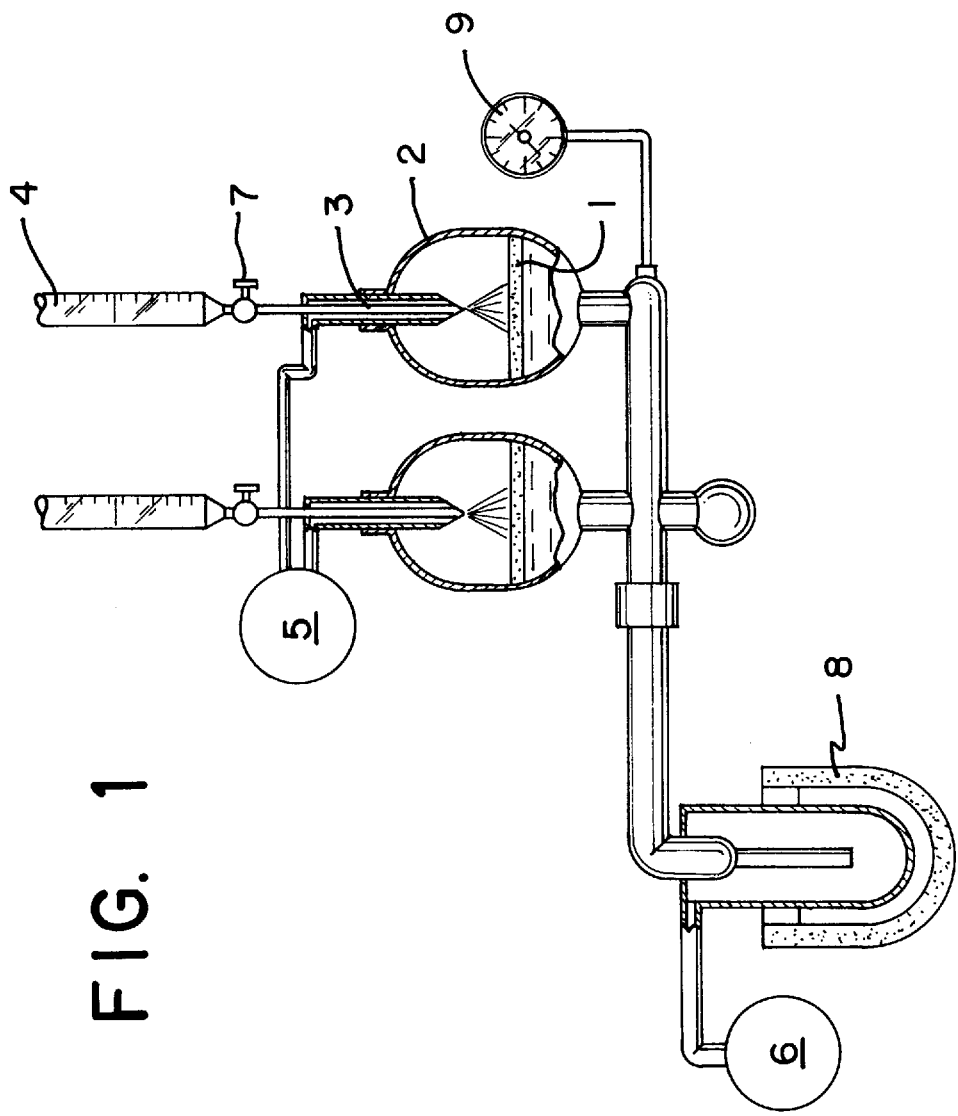
FIG. 1 is a schematic diagram depicting an aerosol generator of the invention.

Aerosol generator of the present invention comprises:

- a chamber having a multiporous filter to generate droplets;
- a nozzle for uniform spray onto the filters, being positioned on the upper part of the chamber;

means for the supply of solution into the chamber, being positioned on the upper part of the chamber;

means for the supply of air into the nozzle; and, means for vacuumizing by which driving force is exerted for the solution to pass through the filter.

In the aerosol generator, the means for the supply of solution may further comprise means for controlling flow rate of the solution, and the means for vacuumizing may further comprise a trap of liquid nitrogen so as to collect liquid. Also, a ceramic filter such as glass, metal and alumina, etc. or polymeric filter having an average pore size of 20 to 30 $\mu$m which is prepared by sintering uniform and fine particles, may be employed as the multiporous filter, and, a pneumatic nozzle and vacuum pump are preferably employed as the nozzle and the means for vacuumizing, respectively.

Apparatus producing ultrafine particles of the invention which is equipped with the aerosol generator comprises:

an aerosol generator equipped with a chamber having a multiporous filter, nozzle, and means for the supply of solution and air, so as to generate droplets;

a pyrogenetic reactor to dry and pyrolyze droplets produced by the aerosol generator to give ultrafine particles;

an ultrafine particle collector to collect the ultrafine particles obtained by the pyrogenetic reactor; and, means for vacuumizing by which driving force is exerted for the solution to pass the filter and for droplets to pass the pyrogenetic reactor.

In the apparatus producing ultrafine particles, the conventional furnace may be employed as the pyrogenetic reactor and the pyrogenetic reactor may further comprises means for controlling the environment of inside of the reactor, and the particle collector conventionally used in the art may be employed as the ultrafine particle collector.

The aerosol generator and apparatus of the present invention is explained in detail with references on the accompanying drawings, which should not be taken to limit the scope of the invention.

Referring to FIG. 1, a schematic diagram depicting the aerosol generator of the invention is provided. As can be seen in FIG. 1, the aerosol generator comprises chambers(2) having multiporous filters(1) to generate droplets; nozzles (3) for uniform spray of solution onto the filters(1), being positioned on the upper part of the chambers(2); means(4) for the supply of solution into the chambers(2), being positioned on the upper part of the chambers(2); means(5) for the supply of air into the nozzles(3); and, means(6) for vacuumizing by which driving force is exerted for the solutions to pass the filters(l).

In this connection, the means(4) for the supply of solution may further comprise means(7) for controlling flow rate of the solution being supplied, and the means(6) for vacuumizing may further comprise a trap(8) of liquid nitrogen for collection of liquid so as to prevent the influx of liquid. And, a pressure gauge(9) to measure the degree of vacuum inside the aerosol generator is positioned in the aerosol generator. A glass filter whose average pore size is 25 $\mu$m and thickness is about 5 mm, which is prepared by sintering uniform and fine glass particles, is perferably employed as the multiporous filter.

In the aerosol generator, solution containing a solute is provided from the means(4) for the supply of the solution through the nozzles(3) which are connected to the means(5) for the supply of air, and sprayed onto the multiporous filters(l) while maintaining the inside of the aerosol generator at a pressure of 60 torr employing the vacuumizing means(6). Thus, thin layer of the solution is formed on the pore wall of the multiporous filters(l), which is, in turn, moved to the lower part of the filters(l) through pores of the filters(l) by the aid of a carrier gas, i.e., air. Then, the solution and air expand simultaneously at the bottom of the filters(l), and a number of droplets of fine size are produced from the numerous pores. Since the aerosol generator produces droplets by expansion of the solution through the multiporous filters(l), the aerosol generator of the invention is named 'filter expansion aerosol generator(FEAG)'.

The size of droplets produced by the aerosol generator depends entirely on the size of the pores of the filter(l), it can be modulated by the variation of pore size of the filter(l). Also, a quantity of droplets thus produced can be simply regulated by controlling the flow rate of the solution being supplied by the aid of the means(7) for controlling flow rate of the solution connected with the means(4) for the supply of the solution, and by controlling the pressure inside the aerosol generator by the aid of the means(6) for vacuumizing.

According to the aerosol generator of the invention, droplets of about 2 $\mu$m size are produced at 60 torr, and the droplets can be produced in large quantity even at 400 torr which is close to atmospheric pressure. As the inside of aerosol generator is maintained at the lower pressure, and as the size of the multiporous filter(1) becomes larger, the higer production of droplets can be achieved. Accordingly, apparatus of high capacity to generate droplets massively, can be easily fabricated by increasing the sizes of the means(6) for vacuumizing and the multiporous filter(1).

Moreover, the aerosol generator of the invention can produce droplets employing various solutions such as aqueous and alcoholic solution, etc., while the conventional ultrasonic spray apparatus have limitations in the production of droplets owing to surface tension of solution. Since the aerosol generator of the invention can produce a large number of droplets even under a low pressure, it can be used effectively in the manufacture of thin layer and the aerosol etching which are carried out under a low pressure.

Referring to FIG. 2, a schematic diagram depicting an apparatus producing ultrafine particles of the invention which is equipped with the aerosol generator, is provided. As can be seen in FIG. 2, the apparatus producing ultrafine particles of the invention comprises an aerosol generator(15) equipped with two chambers each of which have a multiporous filter(11), nozzles(12), and means(13, 14) for the supply of solution and air, so as to generate droplets; a pyrogenetic reactor(16) to dry and pyrolyze the droplets produced by the aerosol generator(15); an ultrafine particle collector(17) to collect the ultrafine particles prepared by the pyrogenetic reactor(16); and, means(18) for vacuumizing by which driving force is exerted for the solution to pass the filters(11) and for droplets to pass the pyrogenetic reactor (16).

In the apparatus producing ultrafine particles of the invention, droplets containing a solute which is produced by the aerosol generator(16), pass through the pyrogenetic reactor(16) to be dried, pyrolyzed, and transformed into ultrafine particles. Ultrafine particles thus produced are collected by the ultrafine particle collector(17). If necessary, environment of nitrogen or inert gas, etc. is provided in the pyrogenetic reactor(16) by the aid of the means(not shown) for controlling environment of the reactor.

The apparatus producing ultrafine particles of the invention can easily generate particles of submicron size which comprise: monocomposite oxide such as ZnO, $Mn_3O_4$, CuO, PbO and NiO; metal particles such as Ag, Ni, Cu, Pd and Au; multicomposite particles such as $YBa_2Cu_3O_7$, $BaTiO_3$, $SrTiO_3$, BST and PZT; and, sulfide particles such as ZnS and CdS.

For example, according to the apparatus of the invention, droplets of 2.1 $\mu$m size can be obtained from 0.2 mol/L of aluminum sulfate solution at a condition of 800° C. and 60 torr, and the alumina ultrafine particles thus produced have a size of 0.37 $\mu$m and the degree of dispersion of 1.76. In this connection, as the inside of aerosol generator is maintained at the lower pressure, the higer production of droplets can be achieved, and a large number of droplets can be generated even under a relatively high pressure of 400 torr. Also, as the size of the filter becomes larger, the higer production of droplets can be achieved.

Further, according to the apparatus producing ultrafine particles of the invention, ultrafine particles of nanometer size containing ZnO, $Mn_3O_4$, PdO and CuO particles can be produced from 0.1 mol/L zinc acetate, manganese acetate, palladium nitrate, and copper nitrate solution, respectively. Production of these ultrafine particles of nanometer size results from the disintegration of large particles in nanophase by the exertion of gas pressure, after the particles are dried at a high temperature and pyrolyzed. Compared with the conventional spray pyrolysis were ultrafine particles of nanometer size can be produced by the disintegration of large particles, only when the solution containing specific solutes causing exothermic reaction is employed, the present invention can produce incohesive ultrafine particles of nanometer size employing both acetate and nitrate solutions which cause exothermic and endothermic reaction, respectively.

Moreover, according to the apparatus producing ultrafine particles of the invention, multicomposite particles of submicron size such as superconductor or superdielectric substance of $YBa_2Cu_3O_7$, $BaTiO_3$, and $SrTiO_3$ can be produced from yttrium nitrate, barium nitrate, strontium nitrate, and copper nitrate solutions. The apparatus can also produce highly crystallized ultrafine particles of multicomponents even under a low temperature.

Finally, according to the apparatus of the invention, pure silver(Ag) crystal particles of submicron size can be produced from silver nitrate solution at over 700° C. in the environment of nitrogen and air. As the concentration of silver nitrate increased from 0.004 to 0.5 mol/L, average size of produced silver particles become increased from 0.22 to 0.72 $\mu$m. Also, as the concentration of the solution becomes lowered, the more silver particles of uniform size distribution is produced. And, silver particles whose size and distribution are large and broad, can be produced at a high temperature.

The apparatus producing ultrafine particles of the invention generates non-cohesive ultrafine particles of nanometer size even under a condition in which only cohesive particles are generated by the conventional apparatus. This advantage results from the steps of generating droplets under a low pressure and pyrolyzing them, which has a distinction over the conventional apparatuses. Moreover, the ultrafine particles produced by the apparatus have a high degree of crystallization and large surface area.

The aerosol generator of the invention can be used in the apparatus for the manufacture of thin layer of ZnO, PZT, BST, and $YBa_2Cu_3O_7$ on the substrate employed in semiconductor, and in the aerosol etching apparatus for a substrate etching, in addition to the apparatus producing ultrafine particles of the invention.

As clearly illustrated and demonstrated above, the present invention provides an aerosol generator and an apparatus producing ultrafine particles equipped with the aerosol generator. The aerosol generator of the invention can produce a large number of fine droplets even under a low pressure, control the size of droplets, thus, can be used effectively in the apparatus for production of ultrafine particles, preparation of thin layers, and aerosol etching. Also, the apparatus of the invention produces ultrafine particles of submicron size which is not cohesive, and has a high degree of crystallization and large surface area, employing various solutes which can be decomposed by both exothermic and endothermic reactions.

What is claimed is:

1. An aerosol generator for generating droplets from a solution which comprises:

a chamber having a porous filter to generate droplets;

a nozzle positioned on the upper part of the chamber for spraying the solution onto the upper surface of said filter;

means for supplying air to mix with the solution being sprayed; and means for supplying a low pressure to the part of said chamber below said filter to exert a driving force for the solution passing through said filter to cause expansion into droplets.

2. The aerosol generator of claim 1, wherein said filter is selected from the group consisting of glass, metal, ceramic and polymeric filters, whose average pore sizes are 20 to 30 $\mu$m.

3. The aerosol generator of claim 1 wherein said means for producing the low pressure driving force comprises means for producing a vacuum.

4. The aerosol generator of claim 1, further comprising means for supplying the solution to said nozzle including a means for controlling flow rate of the solution being supplied.

5. The aerosol generator of claim 3, wherein said means for producing the vacuum further comprises a trap of liquid nitrogen for collection of liquid to prevent influx of liquid to said means for producing the vacuum.

6. An apparatus producing ultra-fine particles which comprises:

an aerosol generator according to claim 1 and further comprising a pyrogenetic reactor to dry and pyrolyze droplets produced by said aerosol generator to produce ultrafine particles;

an ultrafine particle collector to collect the ultra-fine particles obtained by said pyrogenetic reactor; and wherein said means for producing the low pressure driving force to be exerted for the solution to pass through the filter conveys the droplets to pass the through said pyrogenetic reactor.

\* \* \* \* \*